(12) United States Patent
Gardner et al.

(10) Patent No.: US 8,278,895 B2
(45) Date of Patent: Oct. 2, 2012

(54) EFFICIENCY MEASURING CIRCUIT FOR DC-DC CONVERTER WHICH CALCULATES INTERNAL RESISTANCE OF SWITCHING INDUCTOR BASED ON DUTY CYCLE

(75) Inventors: Andrew Joseph Gardner, Louisville, CO (US); Gregory Jon Manlove, Colorado Springs, CO (US); Robert C. Chiacchia, Colorado Springs, CO (US); Hellmuth Stephen Witte, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 228 days.

(21) Appl. No.: 12/755,291

(22) Filed: Apr. 6, 2010

(65) Prior Publication Data

US 2011/0156687 A1    Jun. 30, 2011

Related U.S. Application Data

(60) Provisional application No. 61/290,116, filed on Dec. 24, 2009.

(51) Int. Cl.
*G05F 1/00* (2006.01)
(52) U.S. Cl. .................................... 323/282; 323/283
(58) Field of Classification Search .................. 323/282, 323/283, 284, 285
See application file for complete search history.

(56) References Cited

U.S. PATENT DOCUMENTS

| | | | |
|---|---|---|---|
| 5,982,160 A * | 11/1999 | Walters et al. | 323/282 |
| 6,011,382 A * | 1/2000 | Littlefield et al. | 323/222 |
| 6,294,904 B1 | 9/2001 | Hirst | |
| 6,424,129 B1 * | 7/2002 | Lethellier | 323/272 |
| 6,469,481 B1 * | 10/2002 | Tateishi | 323/282 |
| 7,015,716 B2 | 3/2006 | Chen et al. | |
| 7,436,189 B2 * | 10/2008 | Pai et al. | 324/713 |
| 7,859,324 B2 * | 12/2010 | Yamashita et al. | 327/540 |
| 2003/0080718 A1 | 5/2003 | McDonald et al. | |
| 2005/0035748 A1 * | 2/2005 | Inn | 323/285 |
| 2006/0001408 A1 | 1/2006 | Southwell et al. | |
| 2008/0278123 A1 * | 11/2008 | Mehas et al. | 323/266 |
| 2009/0198460 A1 | 8/2009 | Carroll et al. | |

OTHER PUBLICATIONS

International Search Report and Written Opinion of the International Searching Authority issued in International Patent Application No. PCT/US2010/061095, mailed Mar. 28, 2011.

(Continued)

*Primary Examiner* — Monica Lewis
*Assistant Examiner* — Nguyen Tran
(74) *Attorney, Agent, or Firm* — McDermott Will & Emery LLP

(57) ABSTRACT

An efficiency measuring circuit may measure the efficiency of a DC-DC converter having a switching inductor with an internal DC resistance and a plurality of electronic switches that control current through the inductor. A duty cycle circuit may measure the duty cycle of current flowing through one of the electronic switches. A current sense circuit may measure the current flowing through one of the electronic switches. An inductor voltage sensor circuit may measure the voltage across the inductor. A computation circuit may compute the internal DC resistance of the switching inductor based in part on the duty cycle measured by the duty cycle circuit and the current measured by the current sense circuit. The computation circuit may also compute the efficiency of the DC-DC converter.

24 Claims, 15 Drawing Sheets

OTHER PUBLICATIONS

Lukic, Z., et al., "Self-Tuning Sensorless Digital Current-Mode Controller with Accurate Current Sharing for Multi-Phase DC-DC Converters", Applied Power Electronics Conference and Exposition, Feb. 2009, pp. 264-268, XP031442687.

Yu, W., et al., "Design of High-Efficiency Bidirectional Dc-Dc Converter and High-Precision Efficiency Measuement", Industrial Electronics—34th Annual Conference of IEEE, Nov. 2008, pp. 685-690, XP031410525.

* cited by examiner

EFFICIENCY MEASURING CIRCUIT FOR DC-DC CONVERTER WHICH CALCULATES INTERNAL RESISTANCE OF SWITCHING INDUCTOR BASED ON DUTY CYCLE

CROSS-REFERENCE TO RELATED APPLICATION

This application is based upon and claims priority to U.S. Provisional Patent Application No. 61/290,116 entitled "Low-Loss, High-Accuracy Efficiency Meter for Step-Up and Step-Down Switching Power Supplies," filed Dec. 24, 2009. The entire content of this application is incorporated herein by reference.

BACKGROUND

1. Technical Field

This disclosure relates to switching power supplies and, more particularly, measuring the efficiency of switching power supplies.

2. Description of Related Art

Determining the efficiency of a switching power-supply in situ is an area of growing interest. An incremental reduction in overall power consumption and/or power consumption cost for a plurality of DC-DC converters and their associated loads may be realized by continuously optimizing load allocations in response to changes in the efficiency of one or more of the individual DC-DC converters. In order to make these decisions, real-time information regarding power-conversion efficiency may be required.

Accurately measuring a low-loss, step-down DC-DC converter's efficiency in situ can be challenging. The large output currents and low output voltages required from some high-efficiency step-down DC-DC converters can make the use of a sense resistor to measure output current unattractive. Relying instead upon the internal resistance of the switching inductor can also be problematic. The value of this resistance may vary due to manufacturing tolerances and temperature changes during operation. Thus, it can be difficult to accurately measure efficiency because of difficulties in accurately measuring output current.

SUMMARY

An efficiency measuring circuit may measure the efficiency of a DC-DC converter having a switching inductor with an internal DC resistance and a plurality of electronic switches that control current through the inductor. A duty cycle circuit may measure the duty cycle of current flowing through one of the electronic switches. A current sense circuit may measure the current flowing through one of the electronic switches. An inductor voltage sensor circuit may measure the voltage across the inductor. A computation circuit may compute the internal DC resistance of the switching inductor based in part on the duty cycle measured by the duty cycle circuit and the current measured by the current sense circuit. The computation circuit may also compute the efficiency of the DC-DC converter.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details which may be apparent or unnecessary may be omitted to save space or for more effective illustration. Conversely, some embodiments may be practiced without all of the details which are disclosed. When the same numeral appears in different drawings, it refers to the same or like components or steps.

DETAILED DESCRIPTION OF ILLUSTRATIVE EMBODIMENTS

Illustrative embodiments are now discussed. Other embodiments may be used in addition or instead. Details which may be apparent or unnecessary may be omitted to save space or for a more effective presentation. Conversely, some embodiments may be practiced without all of the details which are disclosed.

Step-Down DC-DC Converter

Apparatus and methods for accurately measuring the efficiency of step down DC-DC converters. The measurement may be made without requiring a precise output current sense resistor, known load current, or a known change in load current. A precise input current sense resistor may be used, but the associated power loss may be minimal. The apparatus and methods may also be used in connection with step up DC-DC converters, as well as multiphase applications.

Figure 1:
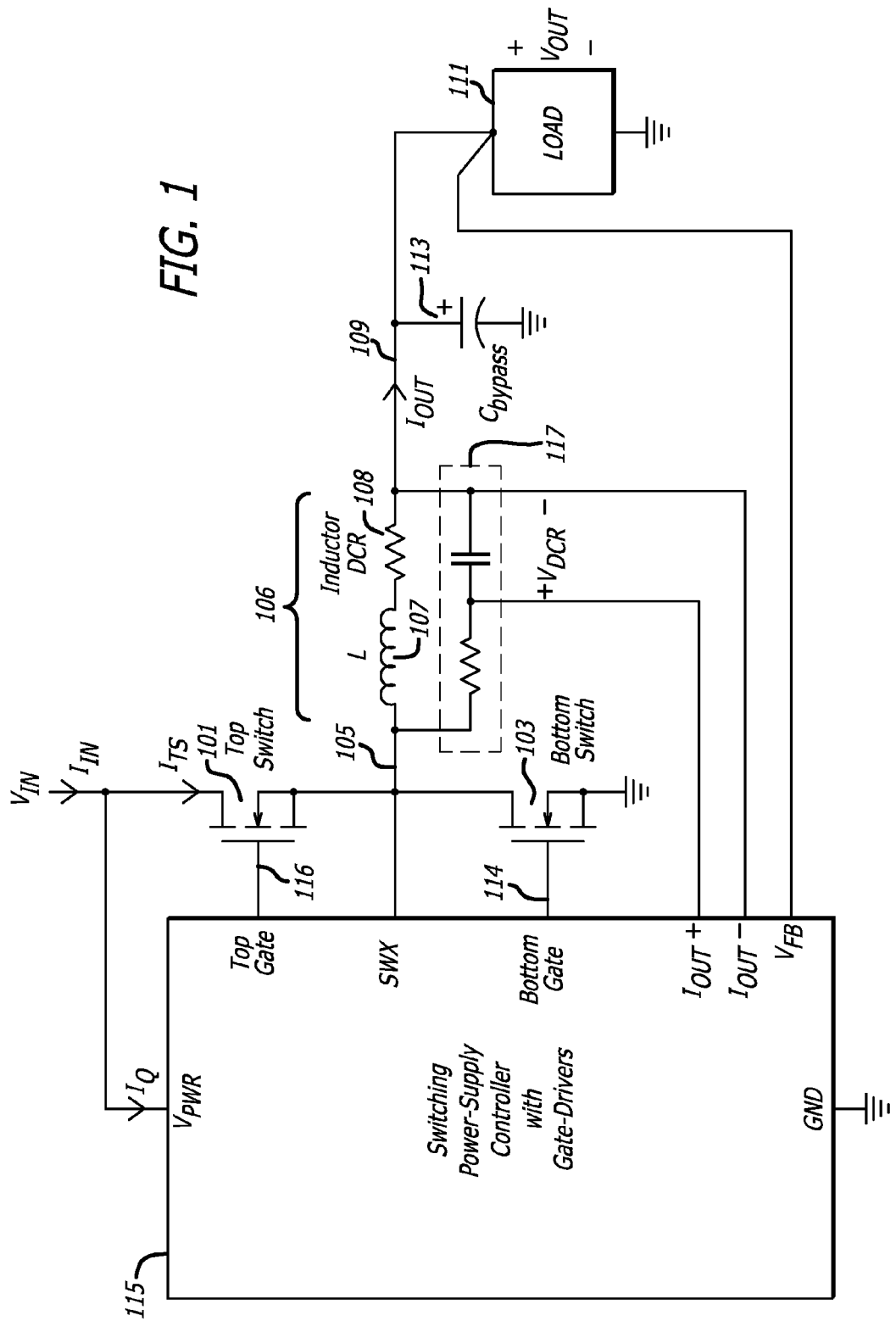
FIG. 1 is an example of a step-down switching DC-DC converter.

FIG. 1 is an example of a step-down switching DC-DC converter. This converter architecture may utilize a top switch 101 and a bottom switch 103 to drive a switching terminal 105 of a switching inductor 106 which may have its other terminal 109 connected to the output of the power supply, such as to a load 111. A switching power-supply controller with drivers 115 may be used to develop the needed drive signals based on various inputs.

The current delivered to the load 111 by the inductor 106 may be filtered by an output capacitor 113. Feedback may be employed in the DC-DC converter to ensure that sufficient energy is stored in the inductor 106 and the output capacitor 113 to satisfy the power consumption requirements of the load 111.

The inductor 106 may be modeled by a resistor 108 in series with an ideal inductor 107. This internal DC resistance modeled by the resistor 108 is referred to herein as the "DCR" of the inductor. This DCR may have a large positive temperature coefficient, e.g., 3900 ppm/° C. A filter network 117 may or may not be used to facilitate the measurement of the DCR voltage, $V_{DCR}$.

The efficiency of the DC-DC converter may be expressed as:

$$\eta = \frac{P_{OUT}}{P_{IN}} = \frac{V_{OUT} \cdot I_{OUT}}{V_{IN} \cdot I_{IN}} \quad (1)$$

where $$I_{IN} = I_{TS} + I_Q \quad (2)$$

Under steady-state load conditions, the time average of the inductor current over one or more switch cycles may be approximately equal to the average load current:

$$\langle I_{LOAD} \rangle \approx \langle I_{INDUCTOR} \rangle = \int_{n \cdot T_{SW}} I_{INDUCTOR} \cdot dt \quad (3)$$

$$n = 1, 2, 3 \dots$$

Similarly, the time average of the input current over one or more switch cycles under steady-state load conditions may be defined as the average input current:

$$\langle I_{IN} \rangle = \langle I_{TS} \rangle + \langle I_Q \rangle = \int_{n \cdot T_{SW}} (I_{TS} + I_Q) \cdot dt \quad (4)$$

$$n = 1, 2, 3 \dots$$

The ratio of the average top-switch current to the average inductor current may be defined as the DC-DC converter's duty-cycle (D):

$$D = \frac{\langle I_{TS} \rangle}{\langle I_{INDUCTOR} \rangle} \quad (5)$$

Duty-Cycle Detection Using Top Gate

Measuring the duty-cycle may be an integral part of determining the relationship between the top-switch current and the output current. An accurate approximation of the duty-cycle may be derived from the top switch's control voltage, i.e. the top-gate voltage, when the inductor current is sufficiently large and in continuous conduction.

Figure 2:
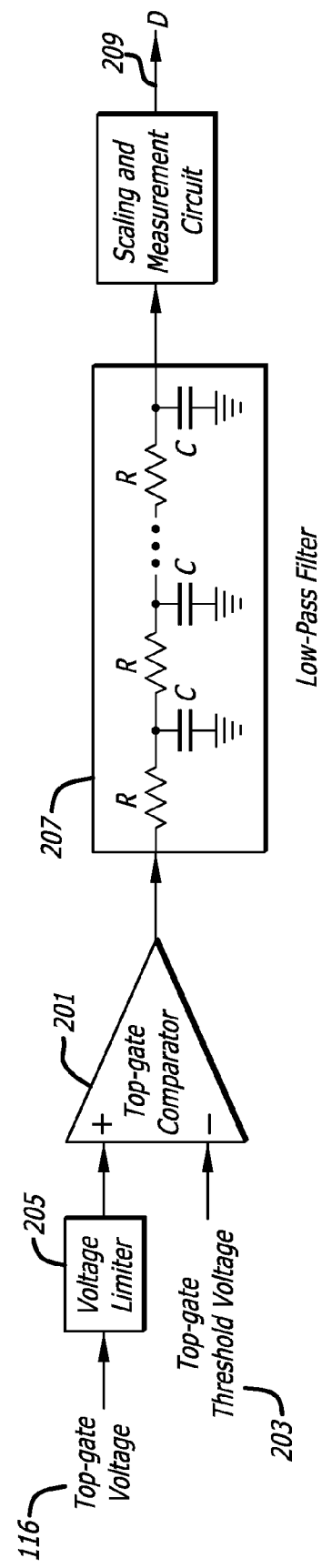
FIG. 2 is an example of a duty cycle circuit for estimating the duty-cycle of a DC-DC converter using the top-gate voltage as an input.

FIG. 2 is an example of a duty cycle circuit for estimating the duty-cycle of a DC-DC converter using the top-gate voltage as an input. The top-gate voltage may be applied to a comparator 201 with a threshold voltage 203 that approximates the on-voltage of the top-switch. A voltage limiter 205 may be employed to limit the overdrive seen by the comparator. The output of the comparator 201 may be filtered by a low pass filter 207 and then measured with respect to the logic high output of the comparator. A scaling and measurement circuit 209 may be employed to normalized and quantize the filter's output voltage.

Figure 3:
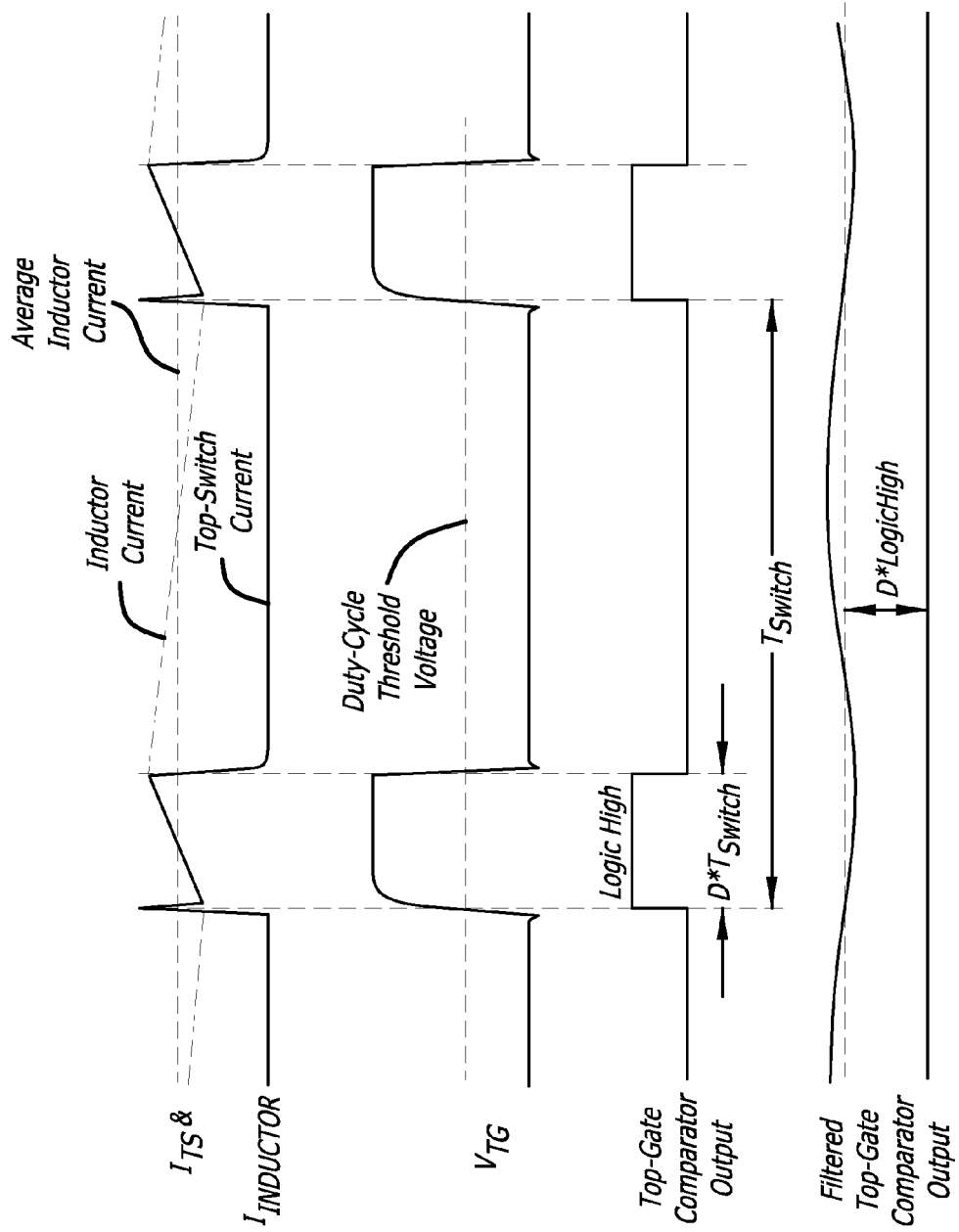
FIG. 3 is an example of waveforms that may be found in the circuits illustrated in FIGS. 1 and 2.

FIG. 3 is an example of waveforms that may be found in the circuits illustrated in FIGS. 1 and 2. These include the top-gate voltage $V_{TG}$, the top-switch's input current $I_{TS}$, the inductor current $I_{INDUCTOR}$, the top-gate comparator output, and the filtered top-gate comparator output which may be representative of the duty-cycle D of the current through the top switch 101. The top-gate comparator threshold voltage 203 may be optimized depending on the on-voltage of the top switch 101.

An alternative method for measuring the duty-cycle of current flowing though the top switch 101 may be to observe the top switch $I_{TS}$ current sense waveform directly, such as through a current sense resistor.

Figure 4:
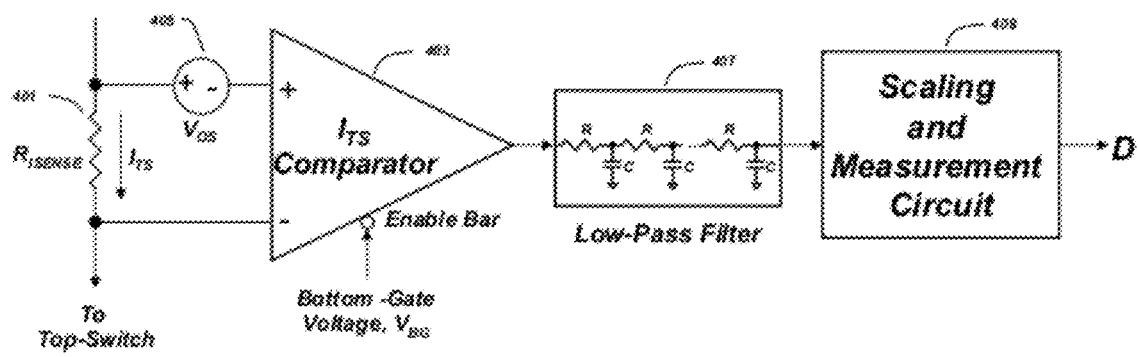
FIG. 4 is an example of a duty cycle circuit for estimating the duty-cycle from $I_{TS}$.

FIG. 4 is an example of a duty cycle circuit for estimating the duty-cycle from $I_{TS}$. The $I_{TS}$ current sense waveform across a sense resistor 401 may be applied to a comparator 403 with a systematic offset voltage 405. The systematic offset voltage 405 may be adjusted so that the comparator overdrive for both the rising and falling edges of the $I_{TS}$ current sense waveform may be roughly equal. This may help ensure that the comparator's rising-edge and falling-edge propagation delays are approximately the same.

The bottom-gate voltage ($V_{BG}$) 114 may be used to enable or arm the comparator during the interval where the bottom switch 103 is not conducting current. It may be advantageous to calibrate the comparator's systematic offset voltage 405 during an interval where the bottom-gate voltage is high. As with the top-gate detection method illustrated in FIG. 2, the output of the comparator 403 may be filtered with a low-pass filter 407 and then measured with respect to the logic high output of the comparator. A scaling and measurement circuit 409 may be configured to normalize and quantify the filter's output voltage. This approach may require the top-switch current polarity be only positive.

Figure 5:
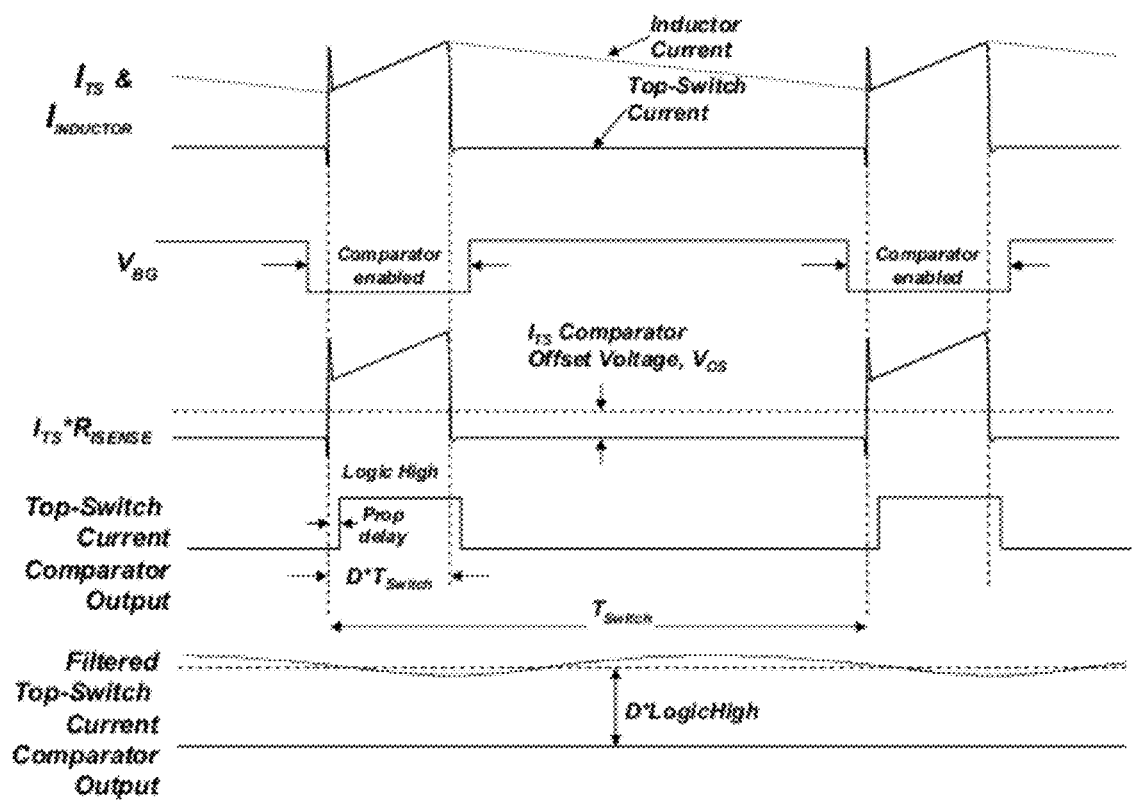
FIG. 5 is an example of waveforms that may be found in the circuits illustrated in FIGS. 1 and 4.

FIG. 5 is an example of waveforms that may be found in the circuits illustrated in FIGS. 1 and 4.

These approaches for estimating the ratio of average inductor current to average top-switch current from the duty-cycle may require certain operating conditions.

First, the DC-DC converter's inductor current may need to be in continuous conduction, i.e. a positive or negative voltage may always need to be switched across the inductor during the switch period. Bottom-gate and top-gate detection may be employed in order to guarantee this condition.

Second, the difference between the time integral of the top-switch current and the time integral of the inductor current may need to be negligible for that fraction of the switching period where the top-switch is conducting current, i.e.

$$\int_0^{D \cdot T_{SW}} I_{TS} \cdot dt \approx \int_0^{D \cdot T_{SW}} I_L \cdot dt \qquad (6)$$

Sources of error in this approximation may include current flowing out of the switch (SWX) node 105 and around the inductor 109 because of the finite impedance of the inductor DCR sense network 117 and SWX node capacitance that may be boot-strapped for only one transition of the SWX node, e.g. low-to-high but not high-to-low.

Figure 6:
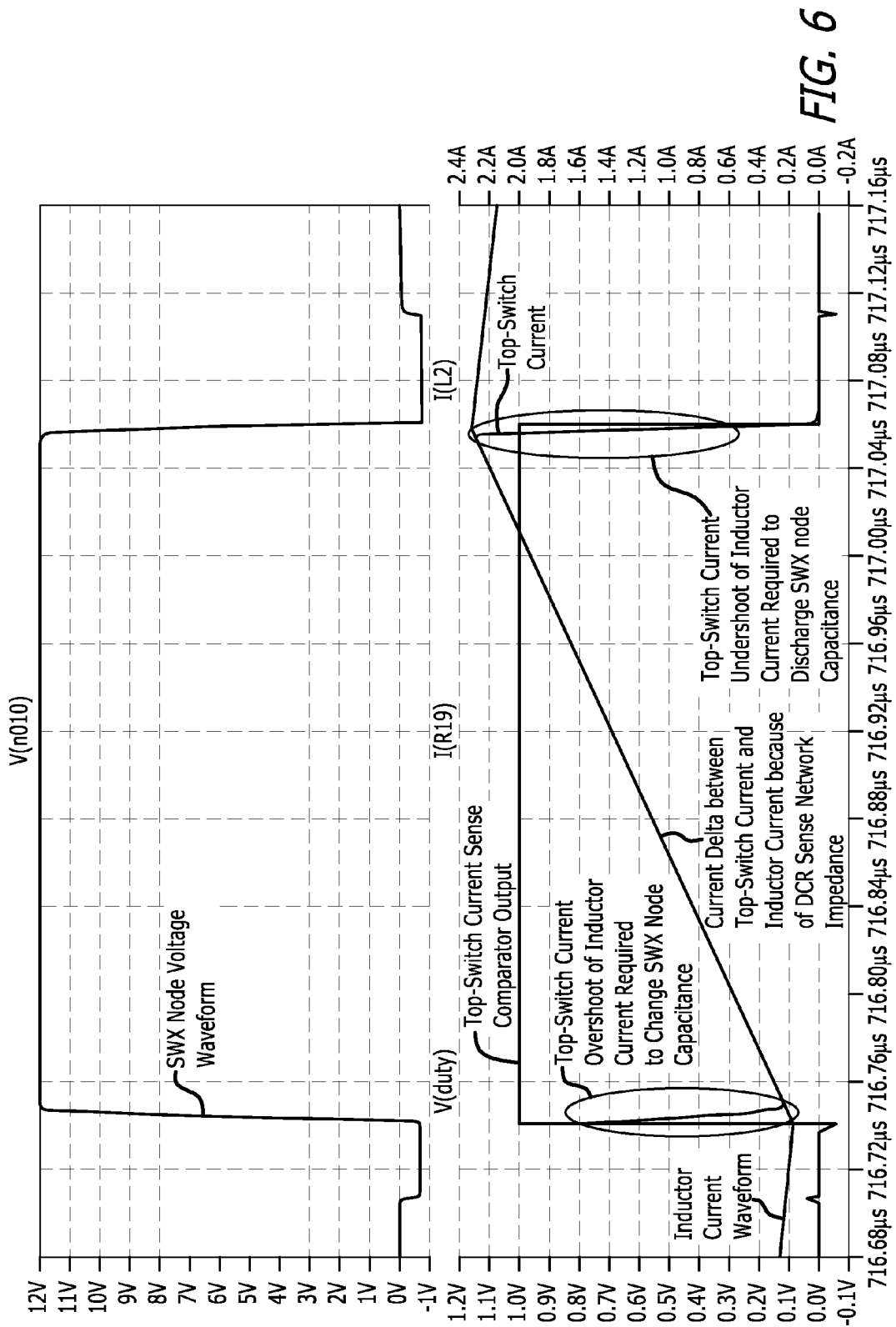
FIG. 6 is an example of relationships that may exist between the top-switch current, inductor current, SWX node voltage, and top-switch current sense comparator output in FIGS. 1 and 4.

FIG. 6 is an example of relationships that may exist between the top-switch current, inductor current, SWX node voltage, and top-switch current sense comparator output in FIGS. 1 and 4.

The aforementioned sources of error may be minimized by making the average inductor current arbitrarily large.

Figure 7:
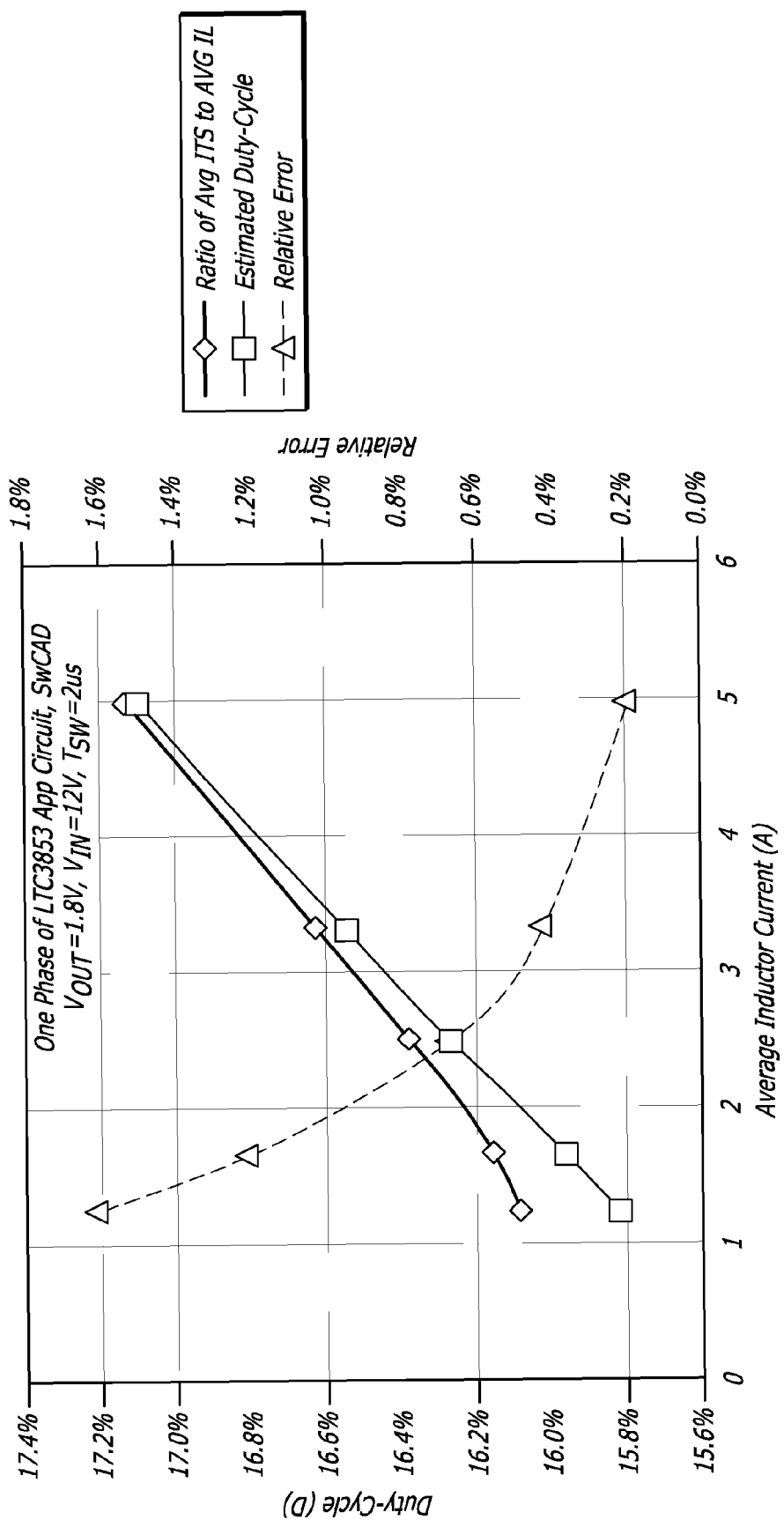
FIG. 7 is an example of relationships between an estimated duty-cycle based on top-switch current detection and a ratio of average top switch current to average inductor current for a step-down DC-DC converter, such as the example converter illustrated in FIG. 1.

FIG. 7 is an example of relationships between an estimated duty-cycle based on top-switch current detection and a ratio of average top switch current to average inductor current for a step-down DC-DC converter, such as the example converter illustrated in FIG. 1. Note how larger average inductor currents may yield a better estimate of the duty-cycle and hence a more accurate measurement of the inductor DCR.

Figure 8:
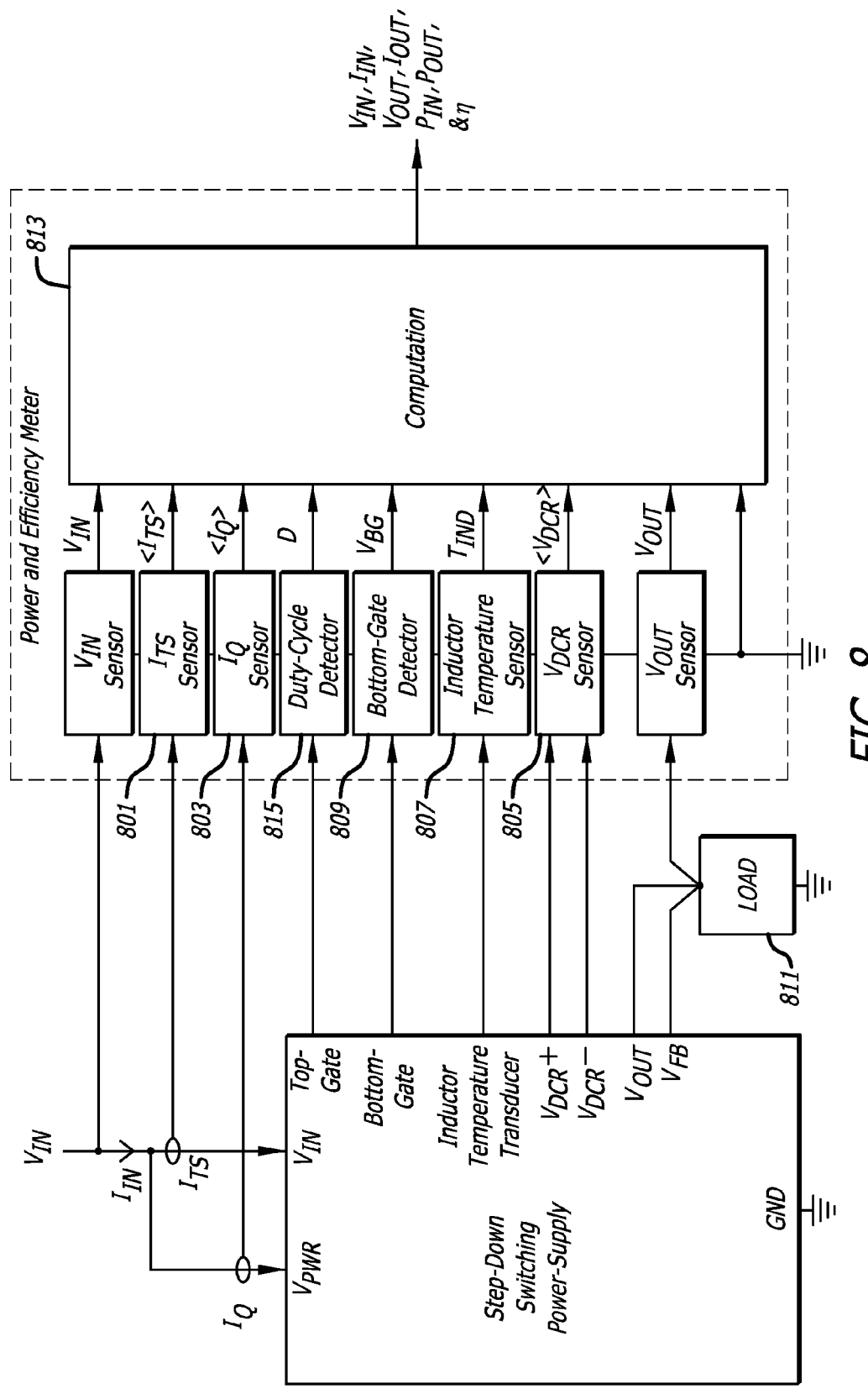
FIG. 8 is an example of a step-down switching DC-DC converter and an associated power and efficiency measuring circuit in which top-gate voltage may be used to estimate duty-cycle.
Figure 9:
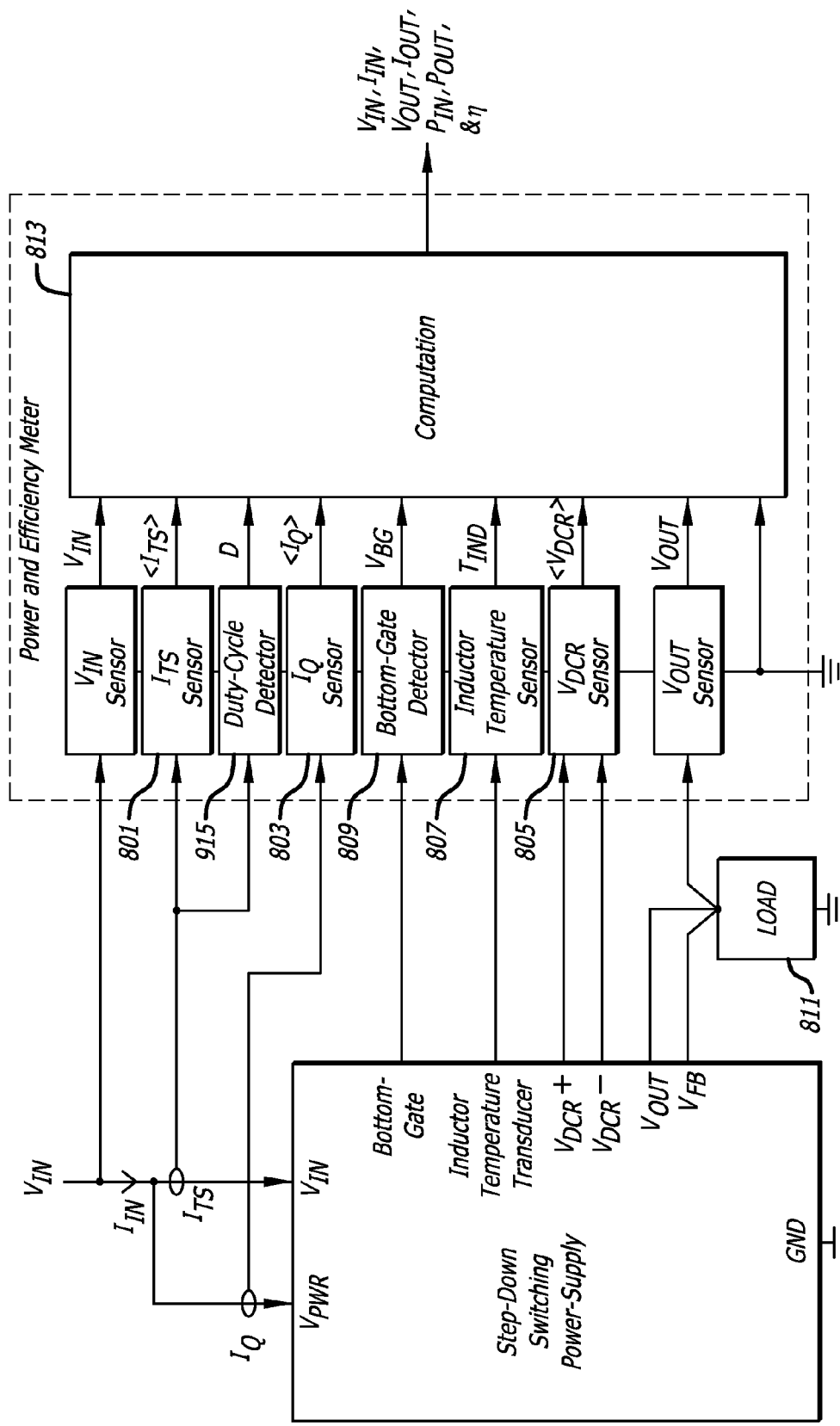
FIG. 9 is an example of a step-down switching DC-DC converter and an associated power and efficiency measuring circuit in which sensed top-switch current may be used to estimate duty-cycle.

FIG. 8 is an example of a step-down switching DC-DC converter and an associated power and efficiency measuring circuit in which top-gate voltage may be used to estimate duty-cycle. FIG. 9 is an example of a step-down switching DC-DC converter and an associated power and efficiency measuring circuit in which sensed top-switch current may be used to estimate duty-cycle. The two may be the same, except the signal which is processed by the duty cycle circuits 815 in FIG. 8 and 915 in FIG. 9. The duty cycle circuit 815 may be configured to determine duty cycle based on the signal to the top gate, while the duty cycle circuit 915 may be configured to determine duty cycle based on the current in the top switch.

An input current sensor 801 in series with the top switch may be used to measure the top-switch input current $I_{TS}$. This element may consist of or include a precision, low-loss resistor. A filter network may be employed in order to facilitate this current measurement. The quiescent current ($I_Q$) of the DC-DC converter controller's current may be measured separately from the top-switch input current by an $I_Q$ sensor 803. This may be done to accurately calibrate the inductor DCR, since $I_Q$ may not be not related to the output current by the duty-cycle. The total input current of the DC-DC converter may be $I_{IN}=I_Q+I_{TS}$, and the total input power may be $P_{IN}=V_{IN} \cdot I_{IN}$.

The voltage drop across the DC-DC converter's inductor DCR may also be measured using an inductor voltage sensor circuit 805. A filter network 117 may be employed in order to facilitate this measurement. Given the sensitivity of the inductor's DCR to temperature, a temperature transducer and associated temperature sensor 807 may be employed to measure the inductor's temperature. The relationship between the inductor's DCR and the inductor's temperature may be expressed as:

$$DCR=DCR_{NOM}[1+(T_{INDUCTOR}-T_{NOM}) \cdot 0.039/^\circ C.] \qquad (7)$$

A bottom-gate detector 809 may be used. In the event that duty-cycle is estimated from top-switch current alone, the bottom-gate voltage may be employed to control when the comparator is armed and when it is in offset calibration mode. The bottom-gate voltage may be also observed in conjunction with the top-gate voltage in order to determine if the inductor current remained in continuous conduction during the inductor DCR calibration interval.

The DC-DC converter's load 811 may be indicated as well. A sufficient load may be applied so that the inductor's current is continuous and sufficiently large to satisfy the aforementioned conditions.

Calibrating Inductor DCR

The following measurements may be made to calibrate the DC-DC converter's inductor DCR:
Average top-switch input current $\langle I_{TS} \rangle$.
Average voltage drop across inductor $\langle V_{DCR} \rangle$.
Duty-cycle (D).
Inductor temperature ($T_{INDUCTOR}$)

These measurements may be made in any order or they may be made simultaneously. It may be desirable to average these quantities. This may be done as part of the measurement, or it may be achieved by averaging multiple measurements. If the measurements are not made simultaneously, it may be necessary for the load current to remain in steady state during the calibration interval. It may be possible to detect changes in the load current by detecting changes in the duty-cycle during the calibration interval. The bottom-gate and top-gate may also be observed in order to guarantee that the inductor current is in continuous conduction during the calibration interval. In the event these requirements are not realized, or if the average inductor current isn't large enough, the results may be discarded and another calibration cycle attempted.

The calibrated, nominal inductor DCR may now be expressed as:

$$DCR_{NOM} = \frac{\langle V_{DCR} \rangle \cdot D}{\{[1 + (T_{INDUCTOR} - T_{NOM}) \cdot 0.0039/^\circ C.] \cdot \langle I_{TS} \rangle\}} \qquad (8)$$

This result may be calculated by a computation circuit 813 and stored in an electronic memory device for later recall and use by the power and efficiency measuring circuit. The memory device may be part of the power and efficiency computation circuit 813 or separate from it.

The calculation of the inductor DCR during the calibration mode may be a one time event, may be performed on demand, may be performed at predetermined intervals, such as when the necessary conditions are satisfied (which may be automatically detected and implemented), or may be performed in accordance with any other plan.

Measuring Input Power, Output Power, and Efficiency

The following measurements may be made to determine efficiency:
Input voltage ($V_{IN}$).
Output voltage ($V_{OUT}$).
Average controller quiescent current $\langle I_Q \rangle$.
Average top-switch input current $\langle I_{TS} \rangle$.
Average voltage across the inductor $\langle V_{DCR} \rangle$.

Inductor temperature ($T_{INDUCTOR}$) may also be re-measured during this time, but it may be much less sensitive to rapid changes in average inductor current, since the thermal time constant of the inductor is typically on the order of seconds.

These measurements may be made in any order or they may be made simultaneously. It may be possible to combine the controller quiescent current and top-switch current in such a way that only one measurement needs to be made instead of two. As before, it may be desirable to average the measurements. It may be necessary however; that these quantities not change significantly if the measurements are made in series. It may be possible to re-use some of the measurements from a previous measurement cycle if they change slowly enough, e.g. inductor temperature.

The DC-DC converter's efficiency ($\eta$) may be expressed as:

$$\eta = P_{OUT}/P_{IN} \quad (9)$$

where $$P_{OUT} = V_{OUT} \cdot \langle V_{DCR} \rangle / \{DCR_{NOM} \cdot [1 + \Delta T \cdot 0.0039/° C.]\} \quad (10)$$

$$P_{IN} = \lfloor V_{IN} \cdot (\langle I_{TS} \rangle + \langle I_Q \rangle) \rfloor \quad (11)$$

$$\Delta T = (T_{INDUCTOR} - T_{NOM}) \quad (12)$$

This computation may be made by the computation circuit 813.

For inductor temperatures where $|\Delta T \cdot 0.0039|$ is much less than 1, the $P_{OUT}$ calculation may be simplified as follows:

$$P_{OUT} \approx V_{OUT} \cdot \langle V_{DCR} \rangle \cdot DCG_{NOM} \cdot \lfloor 1 - \Delta T \cdot 0.0039/° C. \rfloor \quad (14)$$

where $$DCG_{NOM} = 1/DCR_{NOM} \quad (15)$$

This computation may also be made by the computation circuit 813.

One or more $DCG_{NOM}$ values may be calculated a priori to avoid performing a division operation in order to calculate $P_{OUT}$, again by the computation circuit 813.

The inductor current may, during a different mode of operation, be discontinuous. The inductor temperature may also change. The stored value of the inductor DCR may then be used for the computation of current, power, and efficiency measurements using the computation circuit 813 configured to compute the output values set forth in the equations identified above. When the inductor current is subsequently continuous, on the other hand, the current, power, and efficiency measurements may be calculated based on the stored value of the inductor DCR and/or a fresh measurement of the duty cycle using any of the methods described above.

Multiphase Applications

Figure 10:
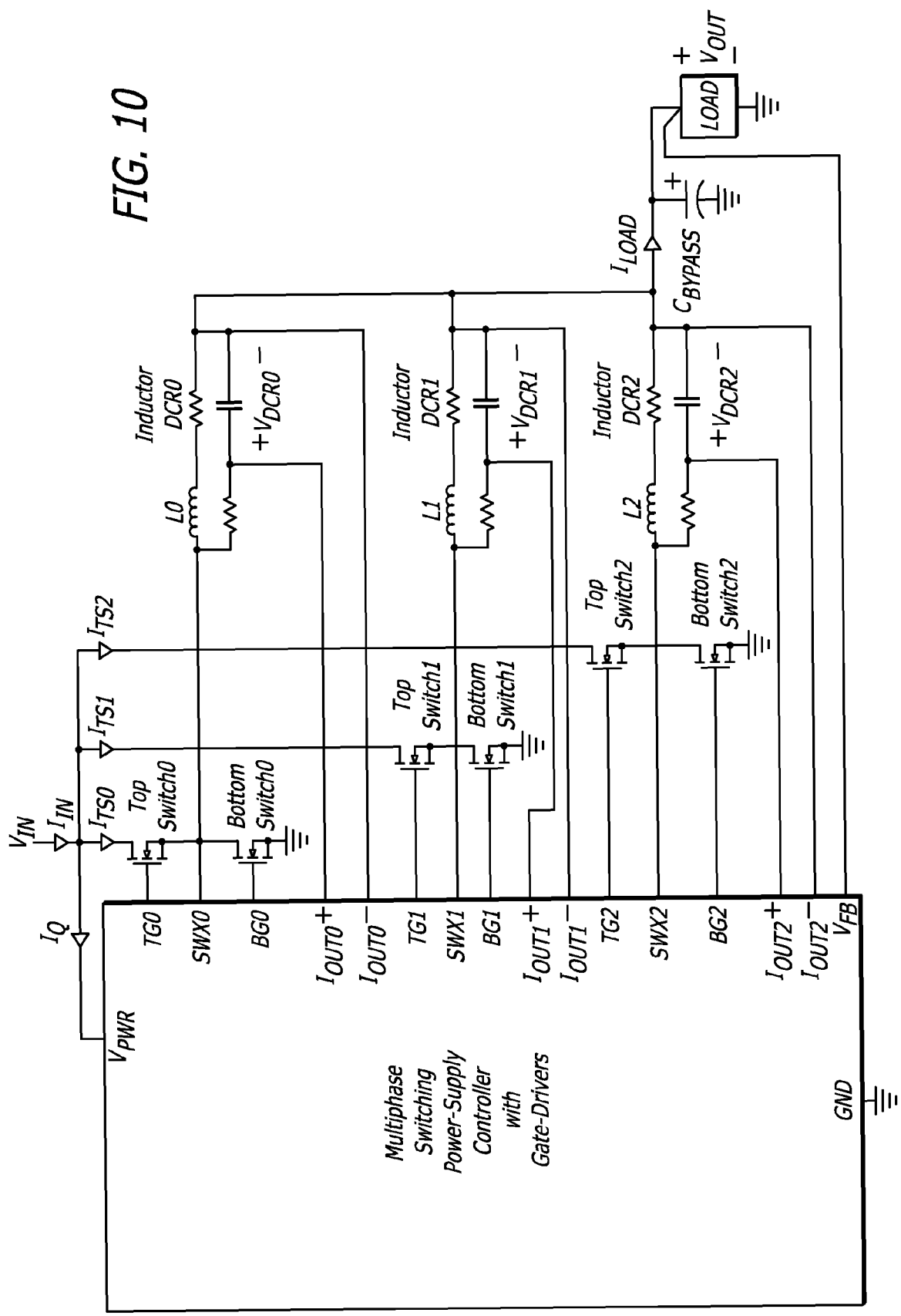
FIG. 10 is an example of a multi-phase step-down DC-DC converter.

FIG. 10 is an example of a multi-phase step-down DC-DC converter. For this type of converter, the PWM top-gate control voltages TG0, TG1, and TG2 and the PWM bottom-gate control voltages BG0, BG1, and BG2 may be phased in order to distribute the various top-switch currents evenly across the switching period $T_{SW}$.

Figure 11:
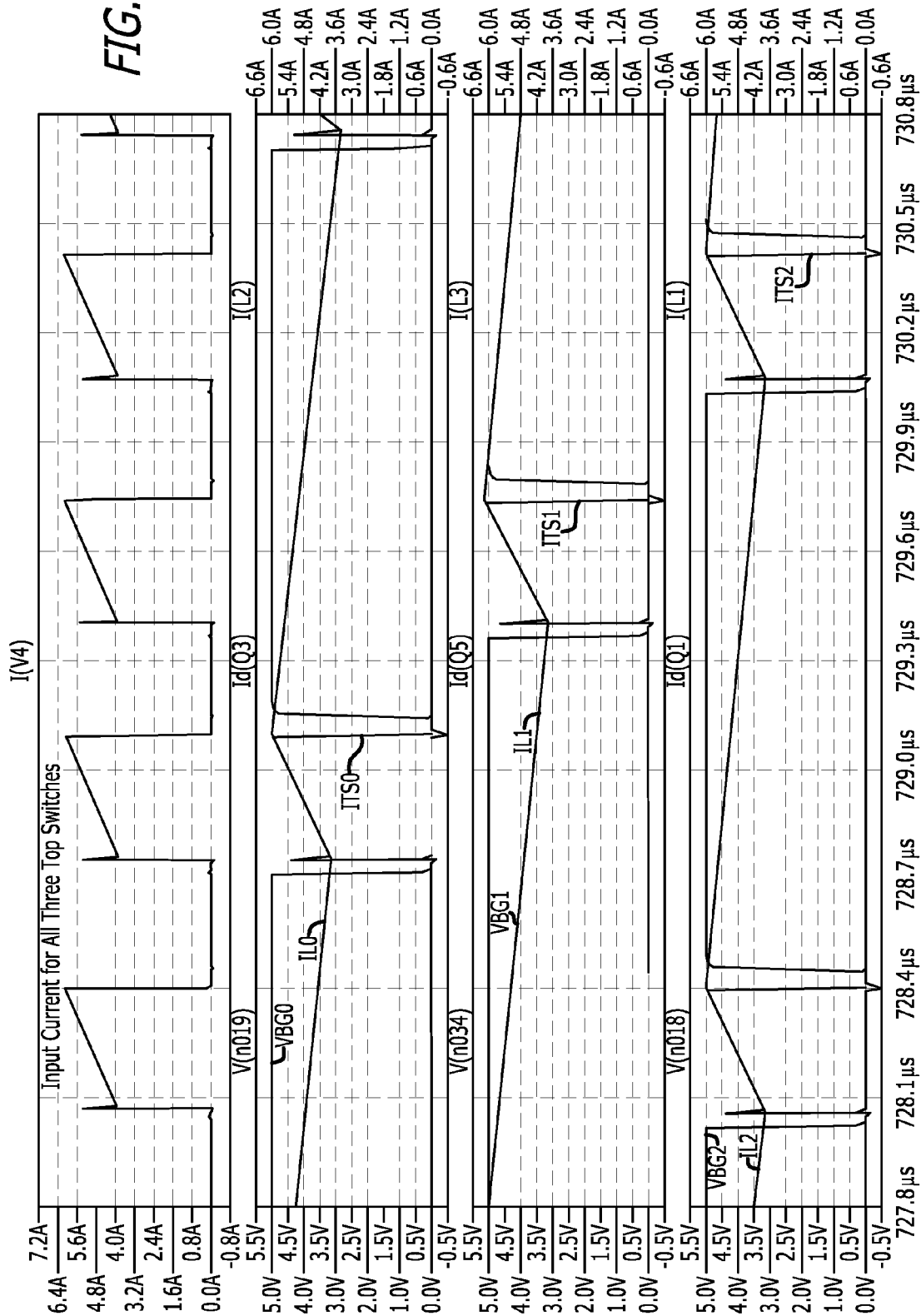
FIG. 11 is an example of waveforms that may be found in the multi-phase step-down DC-DC converter illustrated in FIG. 10.

FIG. 11 is an example of waveforms that may be found in the multi-phase step-down DC-DC converter illustrated in FIG. 10.

Determining output current and inductor DCR in this configuration may be done by having only one input current sense resistor for the entire array. Since DCR0, DCR1, and DCR2 may not be well matched, e.g. ±20% tolerance, it may not be sufficient to measure a single phase's $V_{DCR}$ and assume that the other phases share current equally. Consequently for calibration purposes, each phase's DCR may be determined and stored in an electronic memory device independently by the computation circuit.

In order to determine each phase's top-switch current independently, the bottom-gate voltage may be used to control switches that sample the voltage developed across a common top-switch current sense resistor.

Figure 12:
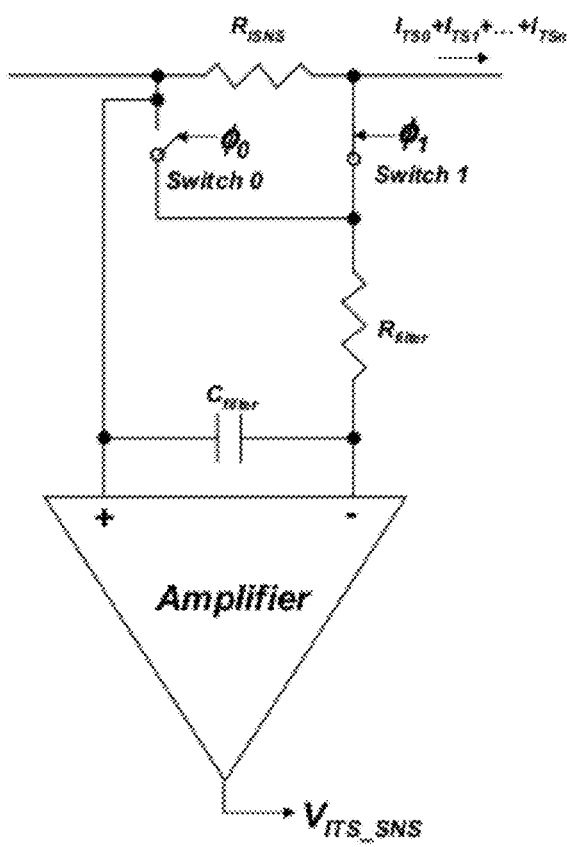
FIG. 12 is an example of a circuit in which bottom-gate voltage may be used to control switches that sample the voltage developed across a common top-switch current sense resistor.

FIG. 12 is an example of a circuit in which bottom-gate voltage may be used to control switches that sample the voltage developed across a common top-switch current sense resistor. Switches 0 and 1 may be driven by overlapping control signals that are derived from a particular phase's bottom-gate voltage. When the bottom-gate voltage of interest is driven low, switch 0 may be disabled, switch 1 may be enabled, and the voltage across the current sense resistor $R_{ISNS}$ may coupled into a low-pass R-C filter that may include $R_{filter}$ and $C_{filter}$. When the bottom-gate voltage goes high, switch 0 may be enabled, switch 1 may be disabled, and the low-pass filter may be isolated from the current sense resistor $R_{ISNS}$. As a result, the voltage developed at the input of the amplifier may be a function of only the top-switch current corresponding to the selected phase. In the event that the average current for all three top-switches in parallel needs to be measured, switch 0 may be disabled and switch 1 may be enabled continuously so that the signal at the input of the amplifier represents the summation of the currents.

Figure 13:
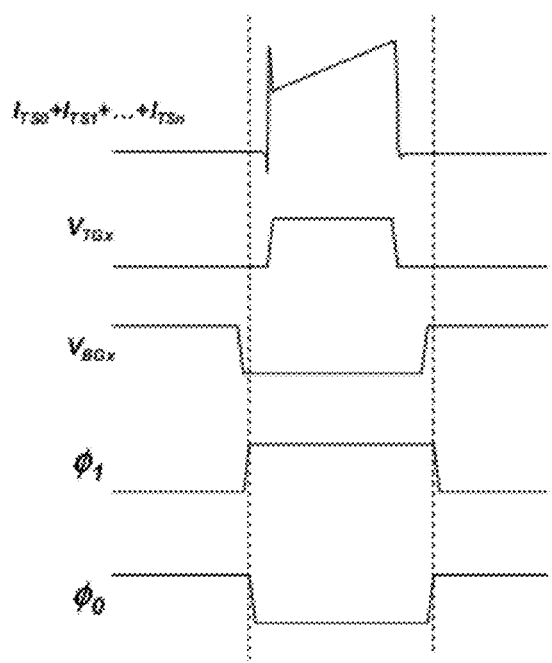
FIG. 13 is an example of waveforms that may be present in FIG. 12.

FIG. 13 is an example of waveforms that may be present in FIG. 12. The approach discussed above in connection with FIG. 12 may assume that the top-switch current waveforms and the corresponding bottom-gate voltages do not overlap and that there is some non-overlap between the active polarity of the bottom-gate and top-gate voltages, all as illustrated in FIG. 13. Consequently, the number of phases that may be independently detected may be limited by the converter's step-down ratio ($V_{OUT}/V_{IN}$) and the aforementioned non-overlaps. For example, no more than three phases may be reliably detected in a DC-DC converter with a step-down ratio of 25%.

Detecting duty-cycle in a multiphase system may be fairly straightforward by detecting either the top-gate control voltage or an $I_{TS}$ sense resistor, as previously described. With the top-gate detection method, only the top-gate voltage may be fed into the top-gate voltage comparator and subsequently processed. This may be done with a simple multiplexer. When duty-cycle is to be estimated only from a phase's top-switch current, the current-sense comparator may be selectively enabled when the corresponding bottom-gate voltage goes low. When the bottom-gate voltage is high, the comparator is inhibited, its output is driven to a logic low, and the resulting duty-cycle estimate is a function of only the selected phase.

Stage-Shedding Approach for Multiphase Applications

Another possible approach for calibrating inductor DCRs in a multiphase application is to perform a series of independent measurements where one or more phases are disabled at a time (stage-shedding).

For example, in a two-phase system, two sets of independent measurements may be performed. During the first calibration measurement, a sufficiently large load may be applied to the output, and the second phase may be disabled while the average input current, first phase duty-cycle, average inductor $V_{DCR}$, and inductor temperature may be measured. The first phase's bottom-gate may be monitored during this interval in order to guarantee that the inductor current is in continuous conduction.

For the second measurement, the second phase may be enabled, and the average input current, second phase duty-cycle, average inductor $V_{DCR}$, and inductor temperature may be measured. The first phase may or may not be disabled during these measurements since its DCR may already be known. If it is not disabled, however, the first phase's duty-cycle, average inductor $V_{DCR}$, and temperature may need to be re-measured and accounted for when solving for the second phase's DCR. As before, the first and second phases' bottom gates may be monitored during this interval in order to guarantee that the inductor currents are in continuous conduction.

Once each phase's inductor DCR has been calibrated, it may be a simple matter to measure output current, power, and efficiency for the multiphase DC-DC converter. While this approach may have some appeal due to its reduced hardware complexity, some applications may be unable to support stage-shedding.

Step-Up DC-DC Converter

It may also be possible to measure the efficiency of a step-up DC-DC converter using an approach similar to the one described for the step-down DC-DC converter.

Figure 14:
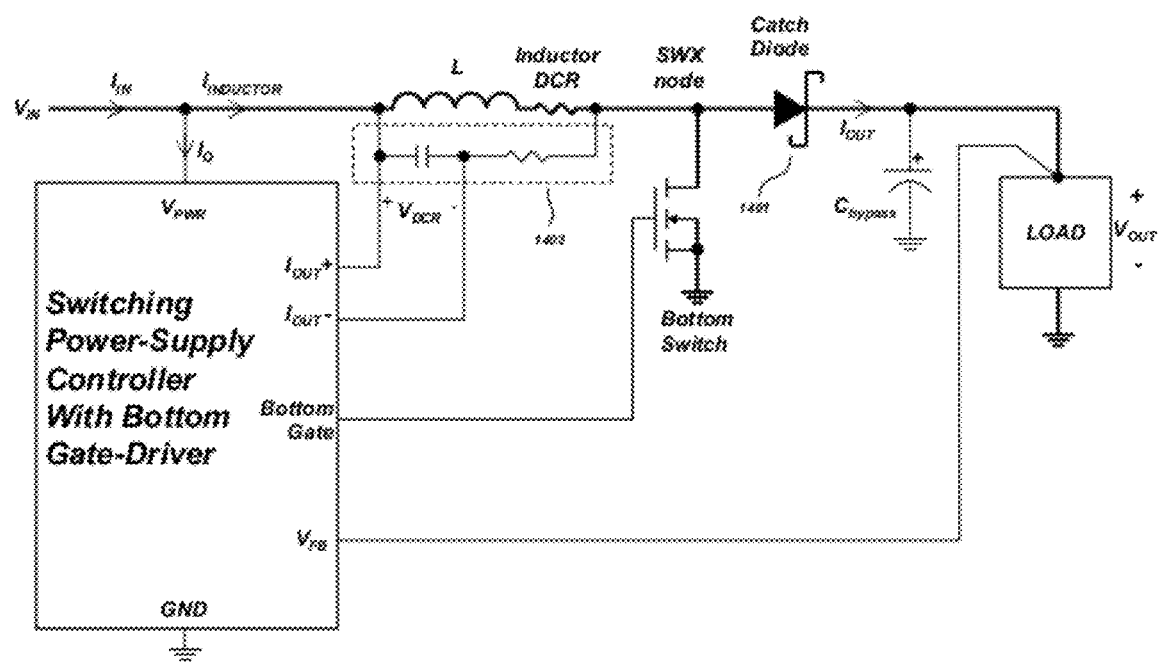
FIG. 14 is an example of a step-up switching DC-DC converter.

FIG. 14 is an example of a step-up switching DC-DC converter. Unlike a high-efficiency step-down converter, a catch-diode 1401 may be used to transfer the inductor current to the load. The catch diode may function as an electronic switch. This approach may yield acceptable efficiency because the duty-cycle and output current levels of the step-up converter may be low enough. Similarly, the addition of a current sense resistor in series with the catch diode may have a minimal impact on efficiency.

Since the top-switch may be absent, it may be necessary to detect the duty-cycle using the voltage across the catch-diode 1401.

Figure 15:
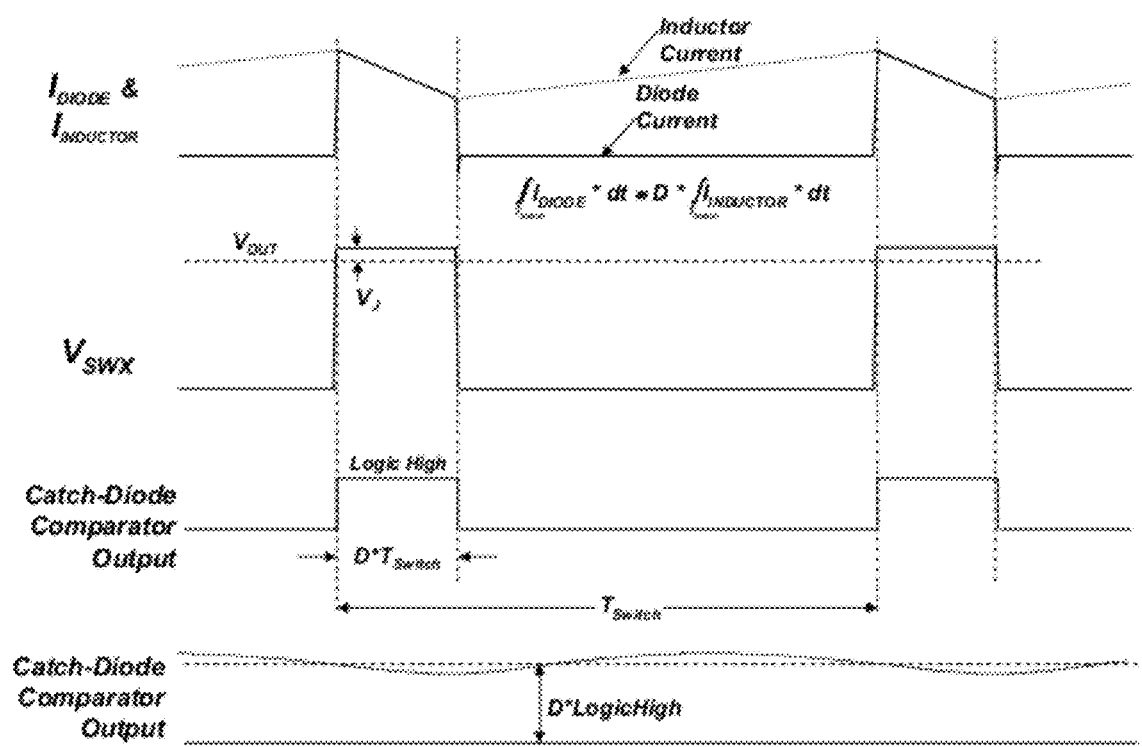
FIG. 15 is an example of waveforms in a duty cycle circuit that may be used with the step-up converter illustrated in FIG. 14.

FIG. 15 is an example of waveforms in a duty cycle circuit that may be used with the step-up converter illustrated in FIG. 14. As before, the assumption may be that the ratio of the average diode current to the average inductor current over 1 or more switch cycles may be approximated by the duty-cycle, i.e.

$$D \approx \int_{n \cdot T_{SW}} I_{DIODE} \cdot dt \bigg/ \int_{n \cdot T_{SW}} I_{INDUCTOR} \cdot dt \quad (16)$$

$$n = 1, 2, 3 \ldots$$

As a practical matter, it may be relatively easy to detect the duty-cycle by this method since the forward drop of the catch diode may be large and abrupt in the presence of the inductor current.

The average voltage drop across the inductor DCR ($V_{DCR}$) in FIG. 14 may be used to detect the input current of the step-up converter. A filter network 1402 may or may not be used to facilitate the measurement of $V_{DCR}$.

Similar operational requirements may apply to the measurements of $I_{OUT}$, D, $V_{DCR}$, as with the step-down DC-DC converter discussed above, namely that the load current may have to be sufficiently large enough keep the inductor current in continuous conduction and minimize relative errors due to charge storage on the SWX node.

Figure 16:
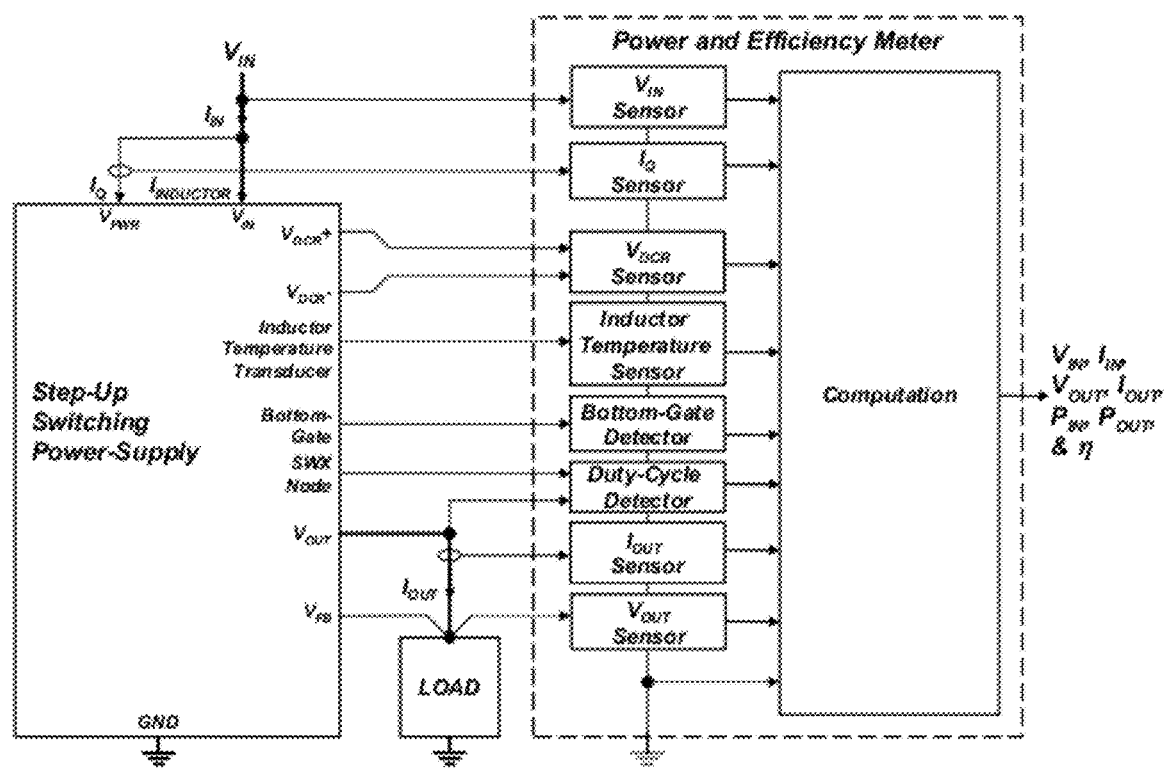
FIG. 16 is an example of a power and efficiency measuring circuit for a step-up switching DC-DC converter.

FIG. 16 is an example of a power and efficiency measuring circuit for a step-up switching DC-DC converter.

The various sensors which have been described, for example, may be any of the types of sensors which have used before for sensing the parameters which these sensors are described above as sensing.

The various circuits which have been described may be implemented with electronic hardware or a combination of electronic hardware and software or firmware. For example, the computation circuit 813 may include a microprocessor and associated firmware configured to perform the computation recited above.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

For example, the output current may be sensed by detecting the output voltage across an element other than the inductor. For example, the output current may be sensed by detecting the voltage across an explicit sense resistor or across the parasitic resistance of a copper trace. The methods described herein for calibrating inductor DCR may also be applied towards the calibration of the alternative current sense element's resistance. In some cases, the resistance and/or placement of the alternative sense element may facilitate the detection of the voltage drop across the device and/or its temperature.

Unless otherwise stated, all measurements, values, ratings, positions, magnitudes, sizes, and other specifications which are set forth in this specification, including in the claims which follow, are approximate, not exact. They are intended to have a reasonable range which is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials which have been described and their equivalents. Similarly, the phrase "step for" when used in a claim is intended to and should be interpreted to embrace the corresponding acts which have been described and their equivalents. The absence of these phrases in a claim mean that the claim is not intended to and should not be interpreted to be limited to any of the corresponding structures, materials, or acts or to their equivalents.

Nothing which has been stated or illustrated is intended or should be interpreted to cause a dedication of any component, step, feature, object, benefit, advantage, or equivalent to the public, regardless of whether it is recited in the claims.

The scope of protection is limited solely by the claims which now follow. That scope is intended and should be interpreted to be as broad as is consistent with the ordinary meaning of the language which is used in the claims when interpreted in light of this specification and the prosecution history which follows and to encompass all structural and functional equivalents.

The invention claimed is:

1. A circuit for connecting to a DC-DC converter having a switching inductor with an internal DC resistance and a plurality of electronic switches that control current through the inductor, the circuit comprising:
    a duty cycle circuit configured to measure the duty cycle of current flowing through one of the electronic switches;
    a current sensor circuit configured to measure the current flowing through one of the switches;
    a voltage sensor circuit configured to measure the voltage across the inductor or across another element which has resistance and is in series with the inductor; and
    a computation circuit configured to compute the:
        internal DC resistance of the switching inductor or the another element based in part on the duty cycle measured by the duty cycle circuit; and
        the current measured by the current sense circuit; and
        the voltage across the inductor or the another element.

2. The circuit of claim 1 wherein the DC-DC converter is a step down DC-DC converter which includes a top switch configured to controllably connect the inductor to a supply voltage and a bottom switch configured to controllably connect the inductor to a ground reference, and wherein the duty cycle circuit is configured to measure the duty cycle of current flowing through the top switch and the current sensor circuit is configured to measure the current flowing through the top switch.

3. The circuit of claim 2 wherein the top switch includes a control input and the duty cycle circuit is configured to measure the duty cycle of current flowing through the top switch by measuring the duty cycle of a signal delivered to the control input of the top switch.

4. The circuit of claim 3 wherein the duty cycle circuit includes:
 a threshold circuit configured to generate a threshold voltage; and
 a comparator configured to compare a signal representative of the signal delivered to the control input of the top switch with the threshold voltage.

5. The circuit of claim 4 wherein the duty cycle circuit includes a voltage limiter configured to limit the magnitude of the signal representative of the signal delivered to the control input of the top switch.

6. The circuit of claim 4 wherein the comparator has an output and wherein the duty cycle circuit includes a filter configured to filter the output of the comparator.

7. The circuit of claim 2 wherein the duty cycle circuit is configured to measure the duty cycle of current flowing through the top switch by measuring the duty cycle of a signal representative of the voltage drop across a sense resistor in series with the top switch.

8. The circuit of claim 7 wherein the duty cycle circuit includes:
 a voltage offset circuit configured to generate an offset voltage; and
 a comparator configured to compare the signal representative of the voltage drop across the sense resistor with the offset voltage.

9. The circuit of claim 8 wherein the comparator has an output and wherein the duty cycle circuit includes a filter configured to filter the output of the comparator.

10. The circuit of claim 1 wherein the computation circuit is configured to cause the computed internal DC resistance of the switching inductor or the another element to be stored in an electronic memory device.

11. The circuit of claim 10 wherein the computation circuit is configured to compute the efficiency of the DC-DC converter based in part on the stored internal DC resistance of the switching inductor or the another element.

12. The circuit of claim 11 wherein the computation circuit is configured to compute the internal DC resistance of the switching inductor or the another element based on the duty cycle of current flowing through the one electronic switch when the current flowing through the inductor throughout the duty cycle is substantially continuous.

13. The circuit of claim 12 wherein the computation circuit is configured to compute the efficiency of the DC-DC converter based on the stored internal DC resistance of the switching inductor or the another element during a duty cycle when the current flowing through the inductor throughout the duty cycle is substantially discontinuous.

14. The circuit of claim 1 wherein the computation circuit is configured to compute an efficiency of the DC-DC converter without utilizing a signal indicative of the voltage across a sense resistor connected in series with the output of the DC-DC converter.

15. The circuit of claim 1 wherein the computation circuit is configured to compute the efficiency of the DC-DC converter without a known load current.

16. The circuit of claim 15 wherein the computation circuit is configured to compute the efficiency of the DC-DC converter without utilizing a signal indicative of the voltage across a sense resistor connected in series with the output of the DC-DC converter.

17. The circuit of claim 1 wherein the DC-DC converter is a step up DC-DC converter.

18. The circuit of claim 17 wherein the DC-DC converter includes a catch diode functioning as an electronic switch and configured to control current through the inductor, and wherein the duty cycle circuit is configured to measure the duty cycle of current flowing through the catch diode.

19. The circuit of claim 1 wherein the computing circuit is configured to compute the internal DC resistance of the switching inductor or the another element during a calibration mode different than when the DC-DC converter is normally operating.

20. The circuit of claim 1 wherein the computing circuit is configured to compute the internal DC resistance of the switching inductor or the another element based in part on an average of the voltage drop across the inductor or the another element and an average of the current through the one electronic switch.

21. The circuit of claim 1 wherein the computing circuit is configured to compute the internal DC resistance of the switching inductor or the another element based in part on the temperature of the inductor or the another element.

22. The circuit of claim 1 wherein the current sense circuit includes a sense resistor in series with the one switch.

23. The circuit of claim 1 wherein the DC-DC converter is a multi-phase DC-DC converter having a plurality of switching inductors and, for each, a plurality of electronic switches that control current the inductor, wherein:
 the duty cycle circuit is configured to measure the duty cycle of current flowing through the electronic switches that controls current through each of the inductors;
 the current sense circuit is configured to measure the current flowing through the electronic switches that control the currents through each of the inductors;
 the inductor voltage sensor circuit is configured to measure the voltage across each of the inductors or across each of another element which has resistance and is in series with each inductor; and
 the computation circuit configured to compute the:
  internal DC resistance of each of the switching inductors based in part on the duty cycle and current of the electronic switch associated with that inductor measured by the duty cycle and current sense circuits.

24. The circuit of claim 1 wherein the voltage sensor circuit is configured to measure the voltage across the inductor.

* * * * *